(12) United States Patent
Jao et al.

(10) Patent No.: US 6,555,296 B2
(45) Date of Patent: Apr. 29, 2003

(54) FINE PITCH WAFER BUMPING PROCESS

(75) Inventors: Raymond Jao, Miaoli Hsien (TW); Eric Ko, Taichung Hsien (TW); Alex Yang, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 86 days.

(21) Appl. No.: 09/827,080

(22) Filed: Apr. 4, 2001

(65) Prior Publication Data

US 2002/0146646 A1 Oct. 10, 2002

(51) Int. Cl.[7] .................... H01L 21/60; H01L 21/44; B23K 31/02; H05K 3/34
(52) U.S. Cl. .................... 430/312; 430/315; 438/610; 438/612; 438/613; 427/96; 427/282
(58) Field of Search ................... 438/610, 612, 438/613; 430/311, 312, 315, 324; 257/779, 780; 427/96, 97, 98, 99, 282

(56) References Cited

U.S. PATENT DOCUMENTS

| | | | |
|---|---|---|---|
| 5,266,446 A | * 11/1993 | Chang et al. | 430/313 |
| 5,587,342 A | * 12/1996 | Lin et al. | 430/315 |
| 5,803,343 A | * 9/1998 | Sarma et al. | 228/180.21 |
| 6,077,765 A | * 6/2000 | Naya | 438/613 |
| 6,109,507 A | * 8/2000 | Yagi et al. | 427/96 |
| 6,264,097 B1 | * 7/2001 | Sano | 438/613 |
| 6,348,401 B1 | * 2/2002 | Chen et al. | 438/617 |

OTHER PUBLICATIONS

"Squeegee Bump Technology"; J–K Lin et al; IEEE Trans. Compt and Packaging Tech. v25,(1), 2002, p. 38–44.*

* cited by examiner

Primary Examiner—Mark F. Huff
Assistant Examiner—Kripa Sagar
(74) Attorney, Agent, or Firm—J. C. Patents

(57) ABSTRACT

A fine pitch wafer bumping process comprises: providing a wafer that has a plurality of contact pads exposed by a passivation layer formed on the surface of the wafer, wherein an under bump metal (UBM) is formed respectively on each contact pad; on the surface of the wafer, forming a first mask film having a plurality of first openings that expose respectively the under bump metals (UBM); filling a first solder material respectively in the first openings; reflowing the first solder material into a plurality of solder posts; on the first mask film, forming a second mask film having a plurality of second openings that respectively expose the first openings; filling a second solder material respectively in the second openings; reflowing the second solder material and the first solder posts; removing the first and second mask films; and reflowing the first and second solder posts to form a plurality of bumps.

15 Claims, 6 Drawing Sheets

FINE PITCH WAFER BUMPING PROCESS

BACKGROUND OF THE INVENTION

1. Field of the Invention

The invention relates to a wafer bumping process. More particularly, the invention relates to a fine pitch wafer bumping process suitable for solder screen printing.

2. Description of the Related Art

In flip chip technology, a wafer bumping process principally consists in forming under bump metal (UBM) structures on contact pads of the wafer and forming bumps on the under bump metal (UBM) structures. Then, the wafer is connected to a substrate through the bumps. In the wafer bumping process, the bumps on the under bump metal (UBM) structures are conventionally formed according to solder screen printing or plating methods. An advantage of the solder screen printing method compared to the plating method for wafer bumping is that its cost is relatively lower. However, a drawback of solder screen printing is that a fine pitch cannot be obtained (a fine pitch is defined as being below 150 μm).

For cost reasons, it is required to shorten the wafer bumping pitch to obtain a fine pitch standard through employing solder screen printing. Conventionally, the wafer bumping pitch is defined as the length resulting from the addition of the width of the solder opening in the mask layer, corresponding to the location where the bump is formed, with the spacing between each opening. To reduce the pitch, one thus may shorten either the width of the mask layer opening or the spacing between each opening. However, issues in connection with solder screen printing are arisen from each of those both ways of processing, as it is described hereafter with reference to FIG. 1 through FIG. 4.

In FIG. 1, conventionally, a wafer 100 has a plurality of contact pads 102 and a passivation layer 104 that is formed thereon exposing the contact pads 102. Each contact pad 102 has formed thereon an under bump metal (UBM) 106. A mask layer 108 is formed on the passivation layer 104, wherein the mask layer 108 has a plurality of openings 108a that expose respectively the under bump metals (UBM) 106. The thickness $t_1$ of the mask layer 108 is conventionally 75 μm. Besides, $S_1$ represents the width of the mask layer opening 108a, and $O_1$ represents the spacing between each opening. The pitch $P_1$, that is, as described above, the sum of the width $S_1$ of the mask layer opening 108a with the spacing $O_1$ between each opening, is conventionally 250 μm.

Referring to FIG. 2, if the width $S_1$ of the mask layer opening 108a is reduced to $S_2$, one must consider the increase of the thickness of the mask layer 108 from $t_1$ to $t_2$ in order to keep the same amount of solder material filled by solder screen printing. However, the increase of the thickness of the mask layer is limited by the conventional constraint of minimum spacing between each opening imposed by the mask layer etching, being within the range of 60% through 70% of the thickness of the mask layer. As a result, the spacing $O_1$ between each opening must be reversibly increased to $O_2$. Thus, the pitch $P_2$ does not allow to have a sought reduction of the pitch.

Referring to FIG. 3 and FIG. 4, other issues in connection with solder screen printing, when reducing the mask layer opening, are schematically shown. In FIG. 3, the thickness of the mask layer 108 is increased from the value $t_1$, as shown in FIG. 1, to the value $t_2$. The mask layer 108, usually a photoresist layer, is less rigid than both the usually silicon layer 100 underlying the mask layer and the scraping cutter 216, made of metallic material and used during solder screen printing. As a result, when the scraping cutter 216 is moved, for example along a direction 218, to fill the opening with solder material 210 by solder screen printing, a cushion effect may occur, resulting in the formation of a recess 220 in the mask layer (see FIG. 3). The resulting deviation of the mask layer surface causes an insufficient filling of the solder material 210a (see FIG. 4) and thus a failure of the ulterior bump formation.

In turn, if the spacing between each opening $O_1$ is shortened (not shown), the required ratio of 60% through 70% between the spacing between each opening $O_1$ and thickness $t_1$ of the mask layer, imposed by the etching, similarly limits the mask layer thickness during solder screen printing. Consequently, a reduction of the thickness $t_1$ of the mask layer must also be considered. Such a reduction of the thickness of the mask layer results in a mask layer opening that is less deep, which thus causes the solder material not to be sufficiently filled and, consequently, a failure of the subsequent bump formation.

SUMMARY OF THE INVENTION

One major aspect of the invention therefore is to provide a wafer bumping process that can employ a solder screen printing method to obtain a fine pitch wafer bumping.

To obtain the fine pitch wafer bumping, when the width of the mask layer opening should be reduced, the present invention proposes increasing the mask layer thickness through separately forming at least two mask films in order to fill the sufficient amount of solder material. As a result, the width of the mask layer opening can be reduced without an increase of the spacing between each opening. Since the thickness of the mask layer is increased through separately forming two mask films relatively thinner than the conventional single mask layer, the solder screen printing for filling the solder material can thus be separately applied to the both relatively thinner mask films, which eliminates the cushion effect issue when the scraping cutter is applied to the mask films. The solder material is sufficiently filled and a fine pitch wafer bumping is obtained.

To obtain the fine pitch wafer bumping, when the width of the mask layer opening is shortened, the present invention proposes separately forming at least two mask films in order to deepen the mask layer openings such that a sufficient amount of solder material can be filled. Since the two mask films that are employed are thinner than the conventional single mask layer, the solder screen printing thus can be separately applied to the both mask films and the limitation condition linking the mask layer thickness and the opening spacing while solder screen printing can be overcome. Hence, the fine pitch wafer bumping can be obtained.

To attain the foregoing and other objects, the present invention provides a fine pitch wafer bumping process that comprises: providing a wafer that has a plurality of contact pads and a passivation layer that is formed on the surface of the wafer while exposing the contact pads, wherein the surface of each of the contact pads has respectively an under bump metal (UBM); forming a first mask film over the surface of the wafer, wherein the first mask film has a plurality of first openings that expose respectively the under bump metals (UBM); filling a first solder material respectively in the first openings; reflowing the first solder material to form respectively a plurality of first solder posts; forming a second mask film on the first mask film, wherein the second mask film has a plurality of second openings that respectively expose the first openings; filling a second solder material respectively in the second openings; reflowing the second solder material and the first solder posts to form a plurality of second solder posts; stripping away the first mask film and the second mask film; and reflowing the first and second solder posts together to form a plurality of bumps.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting.

Referring to FIG. 5 through FIG. 13, schematic cross-sectional views illustrate various steps of the bumping process, according to the preferred embodiment of the present invention.

Figure 1:
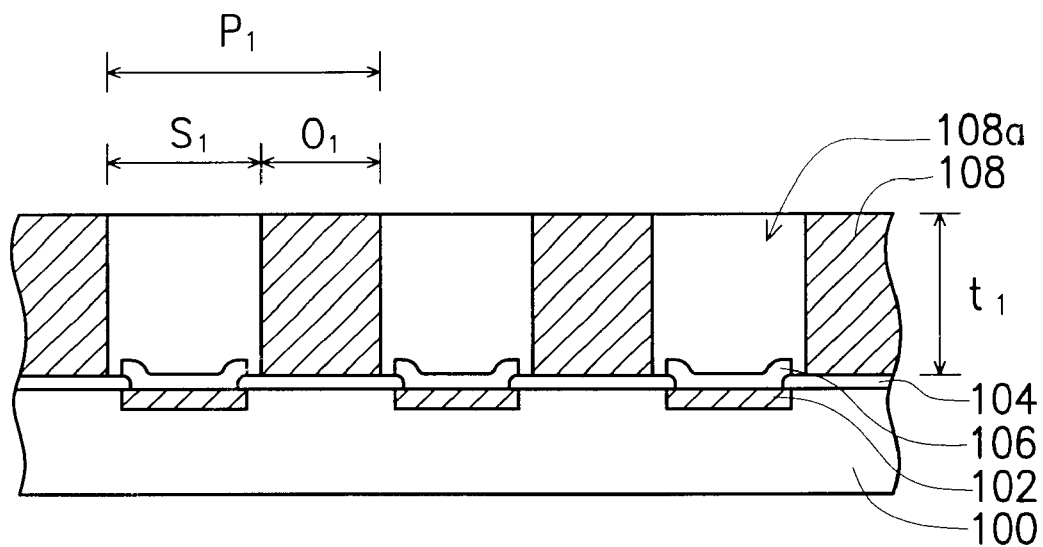
FIG. 1 is a schematic view illustrating the conventional structure for solder screen printing.
Figure 2:
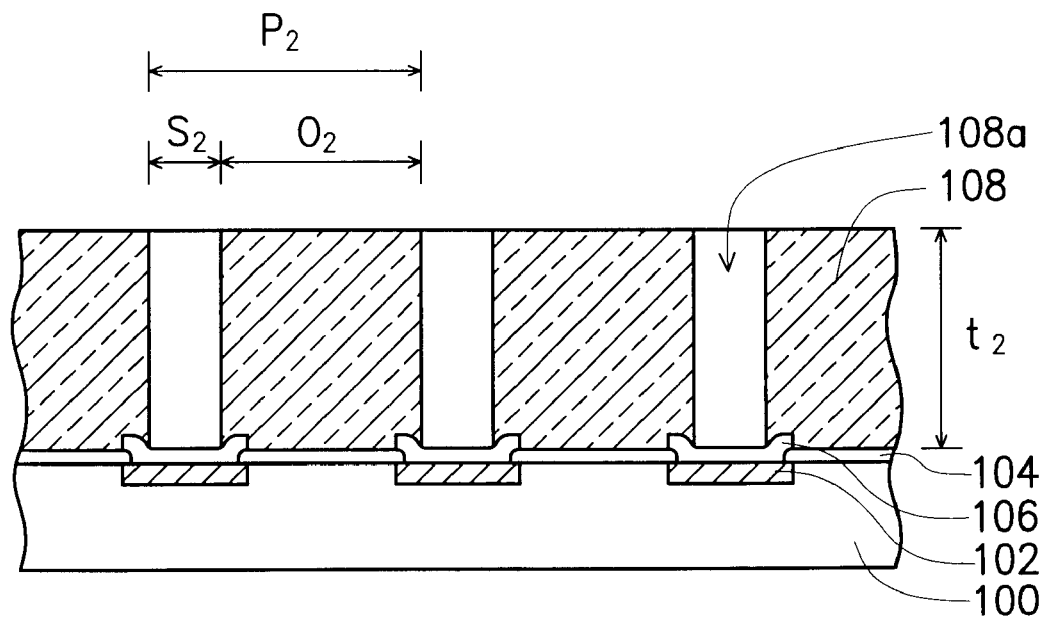
FIG. 2, FIG. 3, and FIG. 4 are schematic views illustrating conventional issues related to solder screen printing for obtaining a fine pitch wafer bumping.
Figure 3:
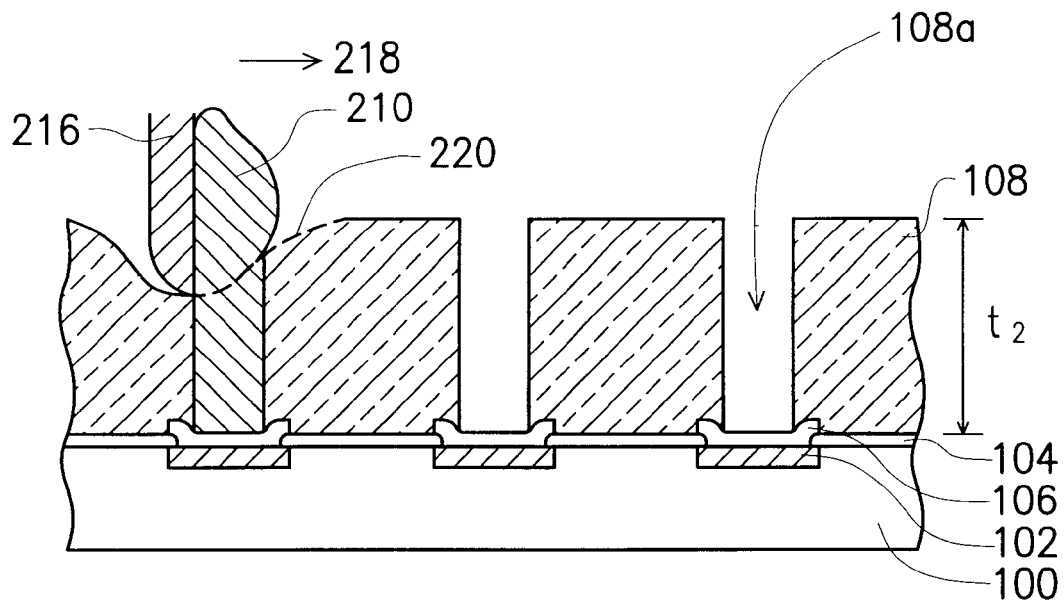
Figure 4:
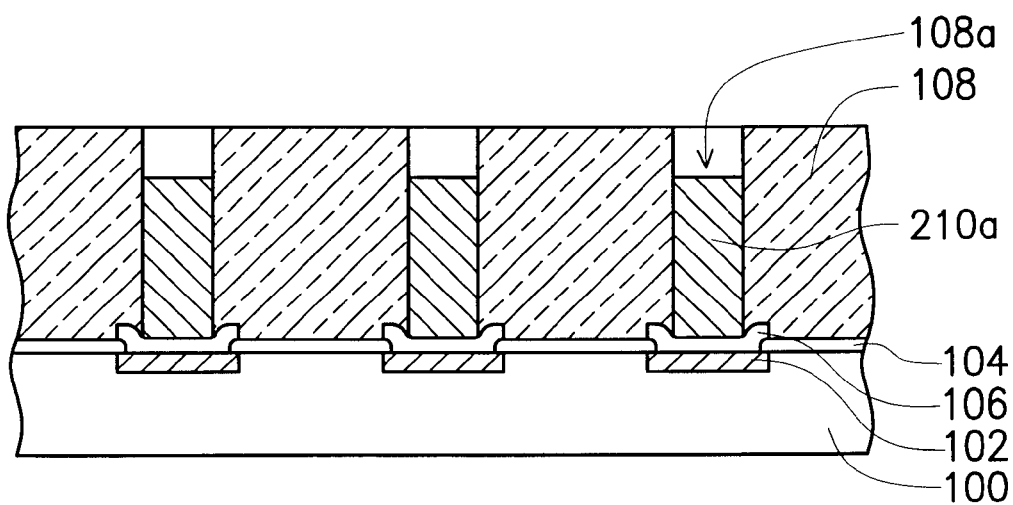
Figure 5:
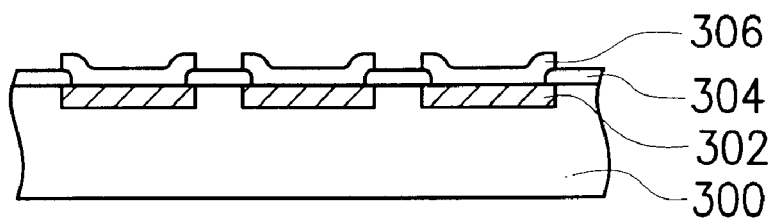
FIG. 5 through FIG. 13 are schematic views illustrating various stages in a fine pitch wafer bumping process according to an embodiment of the present invention.

With reference to FIG. 5, a wafer 300 comprises a plurality of contact pads 302 therein exposed by a passivation layer 304 that covers the surface of the wafer 300. An under bump metal (UBM) 306 is formed on the surface of each of the contact pads 302. The under bump metals (UBM) can be made of chromium, titanium, titanium-tungsten alloy, copper, nickel, chromium-copper alloy, nickel-vanadium alloy, nickel-gold alloy, or any other alloys of the foregoing mentioned materials.

Figure 6:
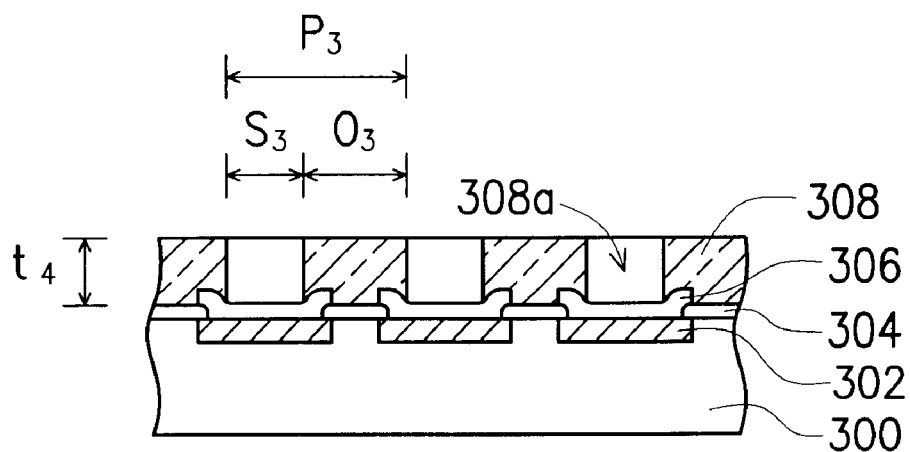

Referring to FIG. 6, a first pattern mask film 308 is formed on the surface of the wafer 300. Conventional processes of photolithography and etching processes (not shown) are applied to the first pattern mask film 308 to form a plurality of first openings 308a, wherein the width of each of the first openings is $S_3$, the spacing between each opening is $O_3$, and the pitch is $P_3$. The width $S_3$ of the opening is smaller than the width $S_1$ of the conventional opening, and the spacing between each opening $O_3$ is smaller than the conventional spacing between each opening $O_1$. The under bump metals (UBM) 306 are exposed by each of the first openings 308a. The first pattern mask film 308 in which are formed the first openings 308a is a photoresist film which thickness is $t_4$. The thickness $t_4$ is 25 μm or 50 μm, those values being not restrictive.

Figure 7:
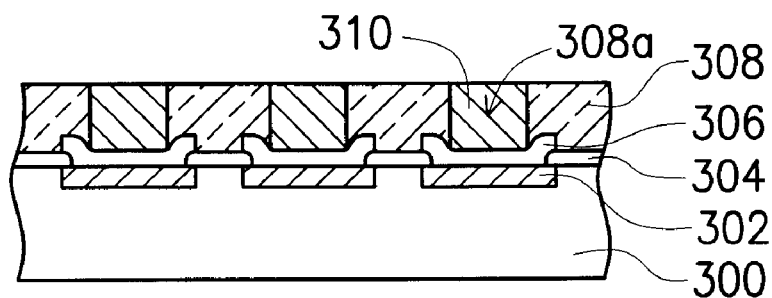

Referring to FIG. 7, a first solder material 310 is respectively filled in the first openings 308a. The filling of the solder material is performed by solder screen printing in the embodiment of the present invention. The solder material 310 can be for example a solder alloy.

Figure 8:
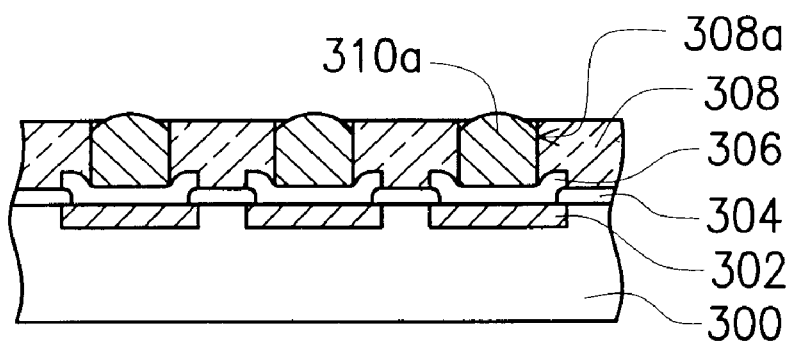

Referring to FIG. 8, a first reflowing of the first solder material 310 is performed to form a plurality of first solder posts 310a.

Figure 9:
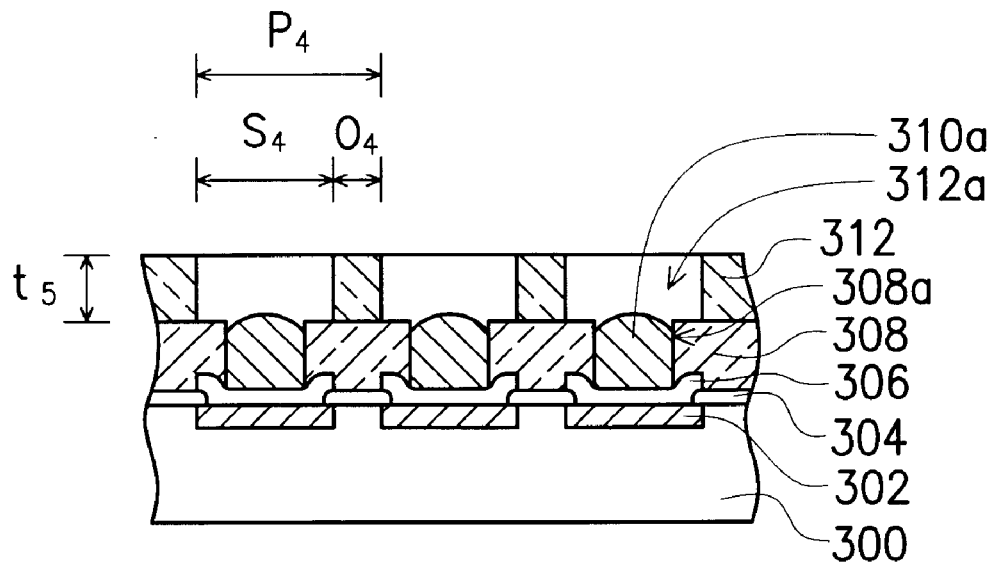

Referring to FIG. 9, a second pattern mask film 312 is formed on the surface of the first pattern mask film 308. Conventional processes of photolithography and etching processes (not shown) are applied to the second pattern mask film 312 to form a plurality of second openings 312a, wherein the second openings 312a expose respectively there through the first openings 308a. The width of the second opening is $S_4$, while the spacing between each opening is $O_4$, and the pitch $P_4$. The width $S_4$ of the second openings is smaller than the width $S_1$ of the conventional opening, while the spacing between each opening $O_4$ of the second openings 312a is also smaller than the conventional the spacing between each opening $O_1$. The second pattern mask film 312 in which are formed the second openings 312a is a photoresist film, and the width $S_4$ of the second openings 312a can be greater or equal to the width $S_3$ of the first openings 308a (see FIG. 6). However, in this embodiment, the width $S_4$ of the second openings 312a is preferably greater than the width $S_3$ of the first openings 308a. As for the first pattern mask film 308, the thickness $t_5$ of the second pattern mask layer 312 can be 25 μm or 50 μm. Those values given as examples of the present embodiment of the present invention are not restrictive.

Figure 10:
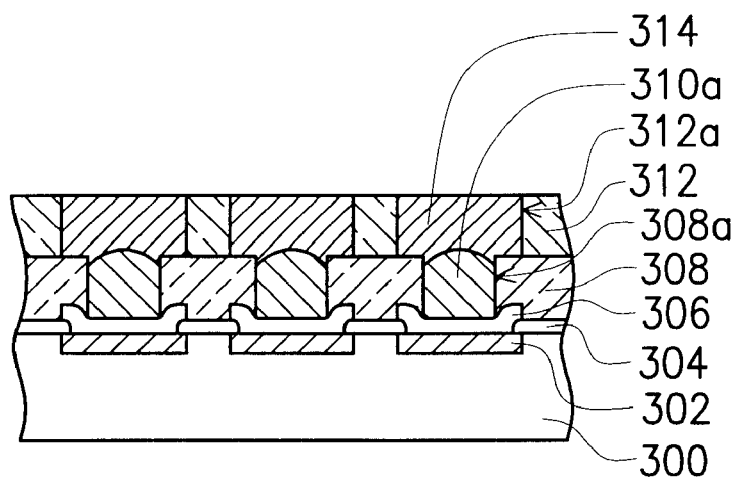

Referring to FIG. 10, a second solder material 314 is then respectively filled in the second openings 312a by solder screen printing, wherein the second solder material can be a solder alloy.

Figure 11:
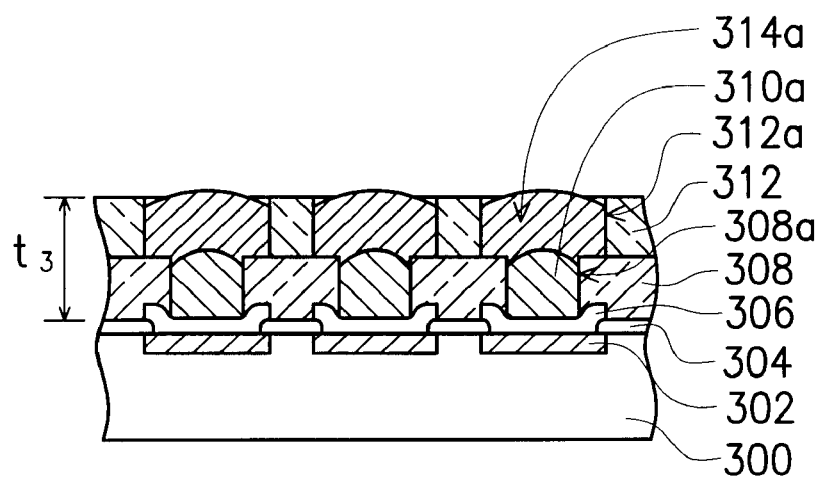

Referring to FIG. 11, a second reflowing of the second solder material 314 and the underlying first solder posts 310a is then performed to obtain a plurality of second solder posts 314a above the plurality of first solder posts 310a.

Figure 12:
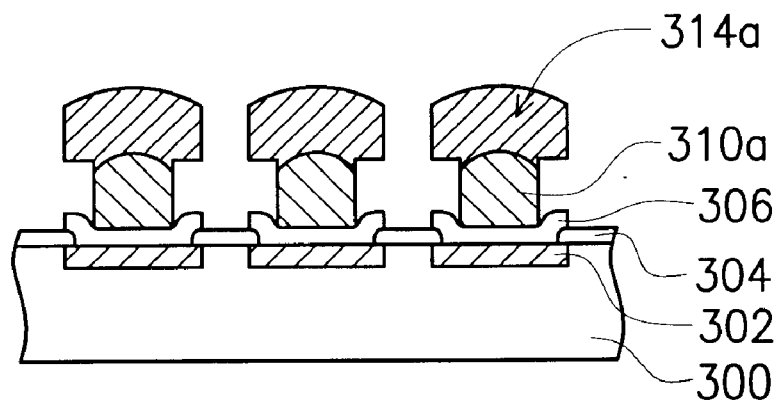
Figure 13:
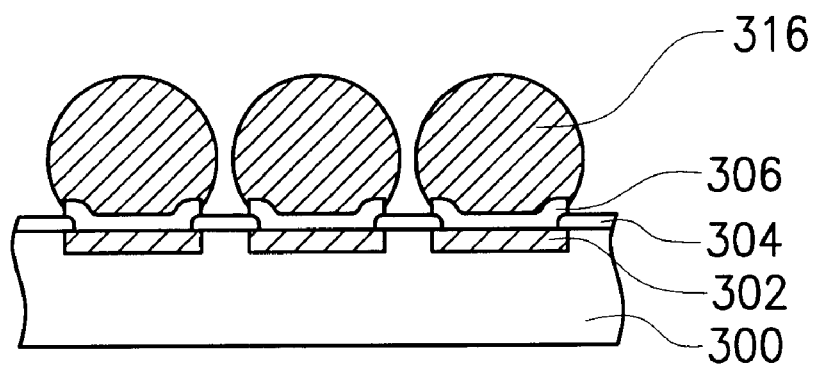

Referring to FIG. 12, the first pattern mask film 308 and second pattern mask film 312 are then removed, for example by stripping, and a third reflowing of the first solder posts 310a and second solder posts 314a forms a plurality of bumps 316, as it is shown in FIG. 13.

The foregoing description of the embodiment of the present invention reveals at least the following features and advantages. The method for wafer bumping of the present invention can be performed by solder screen printing to obtain a fine pitch of the bumping, manufacturing cost is thus advantageously lower than that of a wafer bumping by plating process. Besides, during wafer bumping, when reducing the conventional width $S_1$ of the mask layer opening, in order to maintain the same amount of filled solder material, the height (see $t_3$ in FIG. 11) of the conventional single mask layer is increased through separately forming at least two mask layers (pattern mask films 308 and 312). Hence, the width of the mask layer openings can be effectively reduced without an unfavorable increase of the spacing between each opening, and a fine pitch bumping process thereby can be simply obtained. Since the both mask films are separately formed thinner than the conventional single mask layer, the screen printing process hence can be separately applied to the both relatively thinner films, which eliminates the cushion issue associated with a conventional substantial increase of the mask layer thickness.

Furthermore, when reducing the width of the mask layer opening, at least two mask films are separately formed in order to deepen the mask layer openings such that a sufficient amount of solder material can be filled. Since the two mask films are also thinner than the conventional single mask layer, the solder screen printing can be separately applied to the both relatively thinner mask films. The conventional constraint linking the spacing between each opening with the thickness of the mask layer (ratio between the both within the range 60%~70%) thereby can be overcome. As a result, an advantageous fine pitch wafer bumping can be effectively obtained. The fine pitch wafer bumping process of the present invention with the formation of at least two relatively thin mask films can be employed to obtain a fine pitch less than 150 μm.

Furthermore, when reducing the width of the spacing between each opening, in order to maintain a necessary amount of solder material, at least two mask layers thinner than the conventional single mask layer are advantageously formed to increase the depth of the openings in which is filled the solder material. Each of the thinner mask layers thus can be advantageously formed within the range of a fine pitch.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fine pitch wafer bumping process comprising:

providing a wafer that has a plurality of contact pads and a passivation layer that is formed on the surface of the wafer while exposing the plurality of contact pads, wherein the surface of each of the plurality of contact pads has respectively an under bump metal (UBM);

forming a first mask film over the surface of the wafer, wherein the first mask film has a plurality of first openings that expose respectively the plurality of under bump metals (UBM);

filling a first solder material respectively in the plurality of first openings;

reflowing the first solder material to form respectively a plurality of first solder posts;

forming a second mask film on the first mask film, wherein the second mask film has a plurality of second openings that respectively expose the plurality of first openings;

filling a second solder material respectively in the plurality of second openings;

reflowing the second solder material and the first solder posts to form a plurality of second solder posts;

removing the first mask film and the second mask film; and reflowing the first and second solder posts to form a plurality of bumps.

2. The process of claim 1, wherein the plurality of under bump metals (UBM) is made of chromium, titanium, titanium-tungsten alloy, copper, nickel, chromium-copper alloy, nickel-vanadium alloy, nickel-gold alloy, or any alloys of the foregoing materials.

3. The process of claim 1, wherein the solder material comprises a solder alloy.

4. The process of claim 1, wherein the size of each of the plurality of second openings is greater than the size of each of the plurality of first openings.

5. The process of claim 1, wherein the size of each of the plurality of second openings is equal to the size of each of the plurality of first openings.

6. The process of claim 1, wherein the filling of the first solder material is by solder screen printing.

7. The process of claim 1, wherein the filling of the second solder material is by solder screen printing.

8. The process of claim 1, wherein the first mask film is a photoresist film and is formed through a method comprising depositing a photoresist film, and performing photolithography and etching processes to form the pattern of the plurality of first openings.

9. The process of claim 1, wherein the second mask film is a photoresist film and is formed through a method comprising depositing a photoresist film, and performing photolithography and etching processes to form the pattern of the plurality of second openings.

10. The process of claim 1, wherein the pitch of the plurality of first openings is smaller than 150 μm.

11. The process of claim 1, wherein the pitch of the plurality of second openings is smaller than 150 μm.

12. The process of claim 1, wherein the thickness of the first mask film is approximately 25 μm.

13. The process of claim 1, wherein the thickness of the first mask film is approximately 50 μm.

14. The process of claim 1, wherein the thickness of the second mask film is approximately 25 μm.

15. The process of claim 1, wherein the thickness of the second mask film is approximately 50 μm.

* * * * *